United States Patent
Gianetti

(10) Patent No.: US 8,427,178 B2
(45) Date of Patent: Apr. 23, 2013

(54) DETECTION CIRCUIT FOR USE IN VARIOUS TYPES OF CAPACITIVE TRANSDUCERS AND A TRANSDUCER INCLUDING SUCH A CIRCUIT

(75) Inventor: Gilbert P. Gianetti, Cheyenne, WY (US)

(73) Assignee: The University of Vermont and State Agricultural College, Burlington, VT (US)

( * ) Notice: Subject to any disclaimer, the term of this patent is extended or adjusted under 35 U.S.C. 154(b) by 456 days.

(21) Appl. No.: 12/694,052

(22) Filed: Jan. 26, 2010

(65) Prior Publication Data
US 2010/0219842 A1 Sep. 2, 2010

Related U.S. Application Data

(60) Provisional application No. 61/156,558, filed on Mar. 2, 2009.

(51) Int. Cl.
G01R 27/26 (2006.01)
(52) U.S. Cl.
USPC .................................. 324/679; 324/682
(58) Field of Classification Search .................. 324/661, 324/662, 636, 652, 681, 682, 654; 73/780, 73/718, 724
See application file for complete search history.

(56) References Cited

U.S. PATENT DOCUMENTS

| | | | |
|---|---|---|---|
| 2,496,818 A | 2/1950 | Seeley | |
| 2,497,841 A | 2/1950 | Seeley | |
| 2,501,077 A | 3/1950 | Murakami | |
| 2,528,182 A | 10/1950 | Sands et al. | |
| 2,880,315 A | 3/1959 | Dome | |
| 3,189,825 A | 6/1965 | Lahti et al. | |
| 3,260,935 A * | 7/1966 | Lion | 324/610 |
| 3,319,154 A | 5/1967 | Rudge | |
| 3,409,838 A | 11/1968 | McLeod, Jr. | |
| 3,886,473 A * | 5/1975 | Heyck | 331/42 |
| 4,183,060 A * | 1/1980 | Barnette et al. | 369/106 |
| 4,380,932 A * | 4/1983 | Mott et al. | 73/749 |
| 4,805,463 A * | 2/1989 | Kelledes et al. | 73/862.331 |
| 5,184,331 A * | 2/1993 | Sullivan et al. | 367/135 |
| 7,357,037 B2 * | 4/2008 | Hnat et al. | 73/795 |
| 8,132,761 B2 * | 3/2012 | Gruber et al. | 244/172.5 |

* cited by examiner

Primary Examiner — Melissa Koval
Assistant Examiner — Feba Pothen
(74) Attorney, Agent, or Firm — Downs Rachlin Martin PLLC

(57) ABSTRACT

A detection circuit for detecting changes in capacitance. The detection circuit includes a tuned ratio circuit and an alternating current (AC) source AC-coupled to the tuned ratio circuit. The tuned ratio circuit includes first and second tuned circuits that are tuned to, or close, to the frequency of the AC source. Output circuitry is coupled between the two tuned circuits. During use as a transducer, an active capacitive transducer is inductively coupled to the first tuned circuit. Changes in the capacitance of the active capacitive transducer cause changes in the tuning of the first tuned circuit. The output circuitry generates an output signal that is a function of the difference between the tunings of the first and second tuned circuits.

22 Claims, 4 Drawing Sheets

US 8,427,178 B2

DETECTION CIRCUIT FOR USE IN VARIOUS TYPES OF CAPACITIVE TRANSDUCERS AND A TRANSDUCER INCLUDING SUCH A CIRCUIT

RELATED APPLICATION DATA

This application claims the benefit of priority of U.S. Provisional Patent Application Ser. No. 61/156,558, filed Mar. 2, 2009, and titled "Detection Circuit for Use in Various Types of Capacitive Transducers and a Transducer Including Such a Circuit," that is incorporated by reference herein in its entirety.

FIELD OF THE INVENTION

The present invention generally relates to the field of electrical transducers. In particular, the present invention is directed to a detection circuit for use in various types of capacitive transducers and a transducer including such a circuit.

BACKGROUND

Transducers that translate forces, pressures, displacements, etc. into electrical signals that can be used to measure such forces, pressures, displacements, etc. are used in many applications. A currently popular type of such transducer is a Kulite Type BG-10, manufactured by Kulite Semiconductor Products, Inc. Although these semiconductor strain gauge transducers are widely used, they can suffer from a number of drawbacks, such as being easily damaged by slight overloads applied to the force beam, causing the transducer to be nonfunctional, or have a very large offset voltage, that may not be able to be compensated for in electronic amplifiers.

As mentioned in the above paragraph the semiconductor style of strain gauge is very fragile when made for a low force/weight application, where the gauge itself is physically small. The semiconductor gauges are glued onto the force beam in an area that has a milled-out pocket in the metal beam. This gives an area that "moves" in relation to the applied forces. If the force beam is moved sharply or has more force applied to it than recommended, which can easily happen by dropping the gauge, or over tightening a screw to attach a load to the force beam, the glue holding the gauges may let go, or one or more of the glass-like semiconductor gauges may break making a very expensive device inoperative. If the semiconductor gauge is subjected to larger-than-recommended forces, a large offset voltage may appear on the output signal. This offset voltage may be 2-3 times greater than the desired force signal and may be large enough to not allow compensation by offset controls in signal conditioning equipment.

Another type of transducer available is a capacitive force transducer typically used for measuring small biological force signals. These devices typically contain a free-running resistor-capacitor (RC) oscillating circuit, which generally has a practical upper frequency limit of about 3 MHz due to instability issues. While free-running RC oscillating circuits can go into the hundreds-of-MHz range, stability becomes a major problem at such high frequencies. Even at 1 MHz, the task of frequency compensation is tedious because of the need to hand-select compensation components and oven-test the devices. In addition, the low operating frequency of such a free-running circuit requires the capacitor to be physically large. This slows the response of the circuit to fast external signals and limits the upper frequency range because a small external force must overcome the "at-rest" position of the capacitor plates. A particular 1-MHz free-running RC-circuit-type capacitive transducer investigated by the present inventor was about 2 inches square and about 0.75 inch thick. This large size limits the usefulness of the transducer.

SUMMARY OF THE INVENTION

In one implementation, the present disclosure is directed to a transducer system. The system includes: an alternating current (AC) voltage source for providing a constant frequency voltage; a tuned ratio detector AC coupled to the AC voltage source, the tuned ratio detector including first and second tuned circuits each coupled to the AC voltage source by corresponding respective first and second coupling elements; a transducer link inductively coupled to the first tuned circuit; a transducer electrically coupled to the transducer link; and signal output circuitry electrically coupled between the first and second tuned links.

In another implementation, the present disclosure is directed to a transducer system. The system includes: a cantilever-beam capacitive transducer for providing a transducer signal; a detection circuit for detecting the transducer signal and outputting a measurement signal as a function of the transducer signal, the detection circuit including: an alternating current (AC) voltage source for providing a constant frequency voltage; a tuned ratio detector AC coupled to the AC voltage source, the tuned ratio detector including first and second tuned circuits each coupled to the AC voltage source by corresponding respective first and second coupling elements; a transducer link inductively coupling the cantilever-beam capacitive transducer to the first tuned circuit; and signal output circuitry electrically coupled between the first and second tuned links for outputting the measurement signal; and a housing supporting the cantilever-beam capacitive transducer.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Some embodiments of the present disclosure are directed to unique capacitive-transducer-based transducer systems for converting physical manifestations, such as pressure, force, displacement, strain, translation, vibration, rotation, etc., into electrical signals, and detection circuits for such systems. Other embodiments of the present disclosure may be configured for non-contact measurement of direct current (DC) in DC circuits. Transducer systems and detection circuits made in accordance with the broad concepts of the present disclosure can be made very sensitive and very stable, and transducer systems thusly made can be made small in size and very rugged, if desired.

At a high level, the designs of detection circuits disclosed herein are based on the principles of reactance of a tuned circuit. In one instantiation, the design utilizes a pair of parallel tuned circuits tuned at or near resonance with a oscillating-voltage source, such as a radio-frequency (RF) voltage source. A capacitive transducer is inductively coupled to one of the tuned circuits so that the influence of the pertinent physical manifestation(s) on the capacitive transducer is transformed into variation in the tuned circuit. As the tuning of this circuit is moved off of resonance, the voltage on its output changes, showing up as a positive or negative voltage signal, depending on whether the tuning at a particular instant is above or below resonance. Typically, the output, or measurement, signal is in the hundreds-of-millivolts regime and can be used as is or, in some embodiments, the measurement signal can be amplified to provide a more robust output.

Figures 1A, 1B:
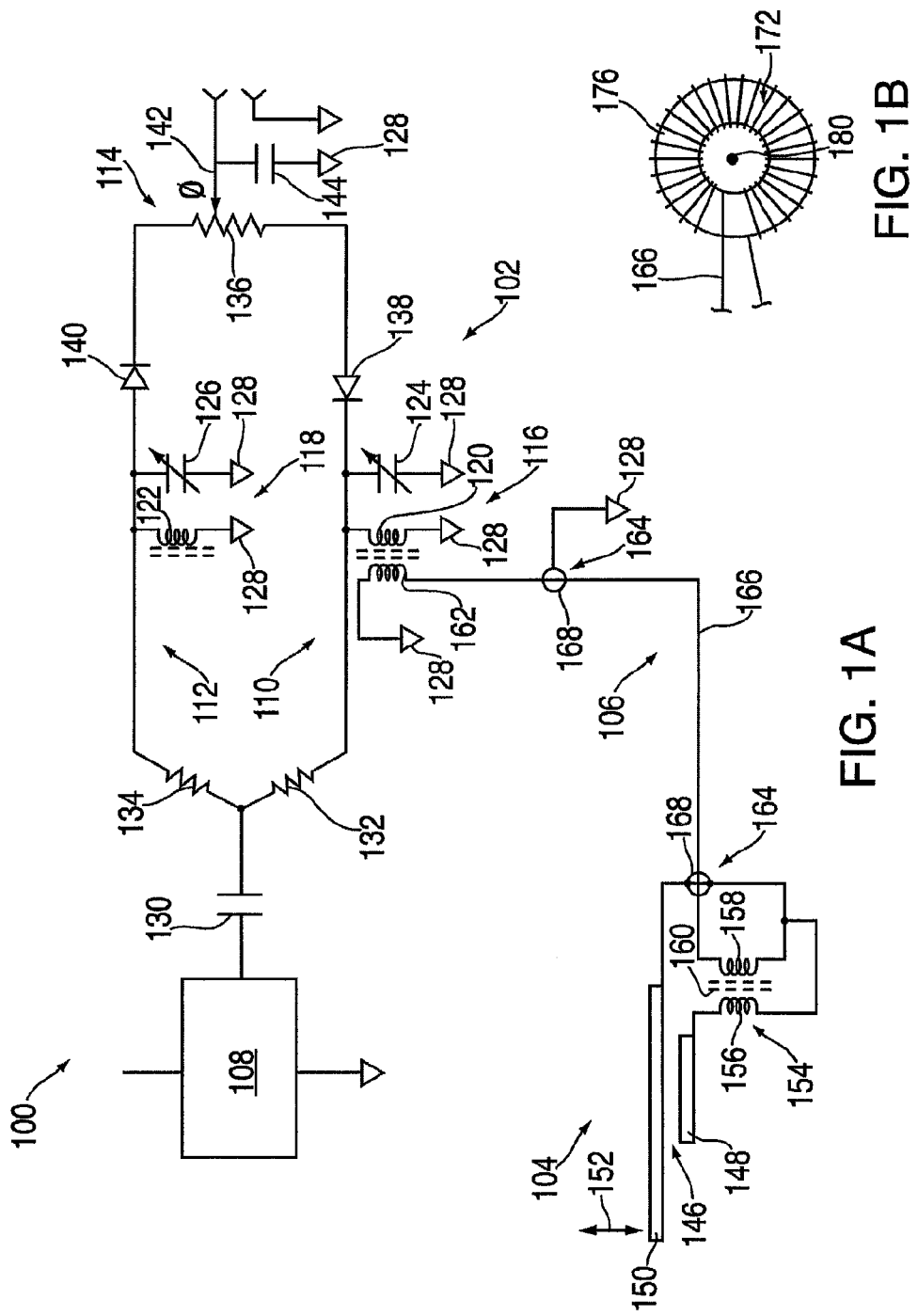
FIG. 1A is a schematic diagram of a transducer system made in accordance with concepts disclosed in the present disclosure.
FIG. 1B is an enlarged elevational view of a sensor for sensing the magnitude of direct current in a conductor that can be used with the detection circuitry of FIG. 1A.

Referring now to the drawings, FIG. 1A illustrates an example transducer system 100 made in accordance with broad concepts of the present invention. Transducer system 100 includes a detection circuit 102, a capacitive transducer 104 and a transducer link 106 connecting the capacitive transducer to the detection circuit. In this example, detection circuit 102 includes an RF voltage source 108, a pair of parallel tuned circuits 110, 112, and output circuitry 114 electrically coupled between the parallel tuned circuits. RF voltage source 108 may be any suitable source that provides a stable RF frequency voltage, such as a crystal oscillator. In one prototype built by the present inventor, RF voltage source 108 was a pre-packaged surface-mount oscillator operating from a 5-volt DC power supply (not shown) and provided a voltage frequency in the megahertz regime.

In this embodiment, each parallel tuned circuit 110, 112 includes an inductor-capacitor pair 116, 118, respectively, each of which contains an inductor 120, 122 and a variable capacitor 124, 126. As described below, capacitors 124, 126 are variable so as to provide a means for tuning corresponding respective parallel tuned circuits 110, 112. Each inductor 120, 122 and capacitor 124, 126 is electrically connected to a signal ground 128. In this example, inductors 120, 122 are of the wound, iron-core type. However, in other instantiations, inductors 120, 122 may be of another type, such as the spiral type etched onto a printed circuit board. It is noted that while in this example capacitors 124, 126 are variable, in other instantiations inductors 120, 122 may additionally or alternatively be variable so as to provide the tuning adjustment needed to tune parallel tuned circuits.

In an out-of-resonance state, parallel tuned circuits 110, 112 exhibit a low impedance to the RF voltage signal coming from RF voltage source 108 until the parallel tuned circuits are brought into resonance using corresponding respective variable capacitors 124, 126. With each inductor-capacitor pair 116, 118 out of resonance, the RF voltage across them is low. When each parallel tuned circuits 110, 112 is brought to resonance, the impedance of the inductor-capacitor pair 116, 118 rises, as does the RF voltage. The two parallel tuned circuits 110, 112 are tuned, or substantially tuned, to the frequency of RF voltage source 108. A further description of the tuning of parallel tuned circuits 110, 112 is provided below in connection with describing the operation of detection circuit.

Parallel tuned circuits 110, 112 are capacitively coupled to RF voltage source 108, for example by a coupling capacitor 130, so as to block any DC voltage originating with the RF voltage source from reaching the parallel tuned circuits. Each parallel tuned circuit 110, 112 is isolated from RF voltage source 108 by a corresponding isolator, in this case a resistor 132, 134, that provides isolation of the sensitive parallel tuned circuit from the RF voltage source. The resistance values of the two resistors 132, 134 are preferably identical to one another. The resistance value selected for resistors 132, 134 is generally not critical. In one example, this resistance value is in the range of about 2 kΩ to about 3.5 kΩ. Other isolators, such as RF transformers, could be used, if desired. However, resistors are typically the least expensive of the isolators that may be used and will often be entirely suitable.

In this example, output circuitry 114 includes a variable resistor 136 and a pair of rectifiers, here single diodes 138, 140, electrically coupled between corresponding respective ones of parallel tuned circuits 110, 112 and the variable resistor. Diodes 138, 140 rectify the RF voltage that appears across parallel tuned circuits 110, 112, and the resulting DC voltage is applied across variable resistor 136. Variable resistor 136 can be used as a zeroing control to remove slight imbalances in the parallel tuned circuits 110, 112. It can also be used to remove any preloads that may be applied to capacitive transducer 104. For example, if capacitive transducer 104 is a cantilever-beam-type transducer, variable resistor 136 can be adjusted to remove a preload from the beam of the transducer. This can be thought of as being analogous to a tare function found on electronic balances. Variable resistor 136 includes a wiper arm 142 that is capacitively coupled to signal ground 128 by a coupling capacitor 144. This capacitive coupling provides filtering for the rectified RF voltage and also inhibits RF energy from detection circuit 102 from reaching any electronic devices (not shown), such as an amplifier, that may be electrically connected to output circuitry 114.

In the example transducer system 100 shown in FIG. 1A, capacitive transducer 104 is of the cantilever-beam type in which the capacitive element 146 includes a fixed charge plate 148 and a movable charge plate 150 electrically isolated from the fixed charge plate. Movable charge plate 150 is fixed at one end and free at the other so as to provide the cantilever-beam characteristic of this type of capacitive transducer. Depending on the direction of an external load 152 applied to movable charge plate 150, the movable capacitor plate moves toward or away from fixed charge plate 148, thereby changing the capacitance of capacitive element 146. It is this change in capacitance that is detected by detection circuit 102 and allows transducer system 100 to measure, in this example, the force applied to movable capacitor plate 150.

The shapes of fixed and movable charge plates 148, 150 are preferably selected so that the output of capacitive transducer 104 is linear as the movable charge plate is moved toward and away from the fixed charge plate. As those skilled in the art will appreciate, this capacitive element could also be used to measure displacement, pressure, etc. In other instantiations of transducer system 100, capacitive element may be of another type, such as, for example, one in which one charge plate translates relative to another charge plate, one in which one charge plate moves toward and away from another without any bending, and one in which a movable dielectric moves in and out of a space between two fixed charge plates. The form of the type of capacitive element selected for capacitive element 146 is up to the designer of capacitive transducer 104.

In this example, capacitive transducer 104 also comprises an RF transformer 154 that includes a pair of primary and secondary windings 156, 158 and, in this example, an iron core 160. Transducer link 106 is a low-impedance link that includes an inductor 162 and a coaxial cable 164 that electrically couple capacitive transducer 104 to detection circuit 102 and allows the capacitive transducer to be spaced from the detection circuit by the distance required for a particular design. It is noted that the length of coaxial cable 164 generally does not affect the performance of transducer system 100 and, so, could be relatively very long, if desired.

Inductor 162 is connected to signal ground 128 and inductively couples the signal (not shown) carried by coaxial cable 164 to detection circuit 102. Coaxial cable 164 includes a core conductor 166, which caries the signal, and a grounded sheath 168 grounded to signal ground 128. Primary winding 156 of RF transformer 154 is electrically coupled between core conductor 166 and ground sheath 168. In this example, secondary winding 158 is electrically coupled between fixed charge plate 148 and ground sheath 168, and movable charge plate 150 is electrically coupled to the ground sheath of coaxial cable 164. Capacitive element 146 is across secondary winding 158 of RF transformer 154 and forms a parallel tuned circuit very similar to parallel tuned circuit 110 formed by inductor-capacitor pair 116.

Very slight changes in capacitance of capacitive element 146 caused by physical movement of movable charge plate 150 relative to fixed charge plate 148 are translated to inductor-capacitor pair 116 and affect the resonance of parallel tuned circuit 110. With proper adjustment to parallel tuned circuits 110, 112, movement of movable charge plate 150 of capacitive transducer 104 in one direction will provide a positive output voltage at output circuitry 114, and movement in the opposite direction will provide a negative output voltage. The amount of voltage varies with the applied force on movable charge plate 150. In a prototype built by the present inventor, the output signal from wiper arm 142 of variable resistor 136 was approximately 20 millivolts per gram of force on cantilevered movable charge plate 150.

While the example of FIG. 1A is directed to a device for measuring a force, pressure, displacement, etc. based on a physical movement of movable charge plate 150 relative to fixed charged plate 148, transducer system 100 of FIG. 1A can be modified to sense the amount of current flowing in a wire carrying direct current. The changes to the basic circuit needed to accomplish this are minimal. For example, transducer system 100 can be modified to a DC-measuring system by making secondary winding 158 (FIG. 1A) into a winding 172 (FIG. 1B) (formed from core conductor 166 of FIG. 1A) on a toroidal core 176 (FIG. 1B) and resonating this winding with a fixed value of capacitance. A conductor 180 extending through the opening of toroidal core 176 and carrying direct current will change the permeability of the toroidal core and cause a voltage output signal on core conductor 166 that is proportional to the direct current in conductor 180. The voltage output signal on core conductor 166 would then be detected by detection circuit 102 (FIG. 1A).

Figure 2:
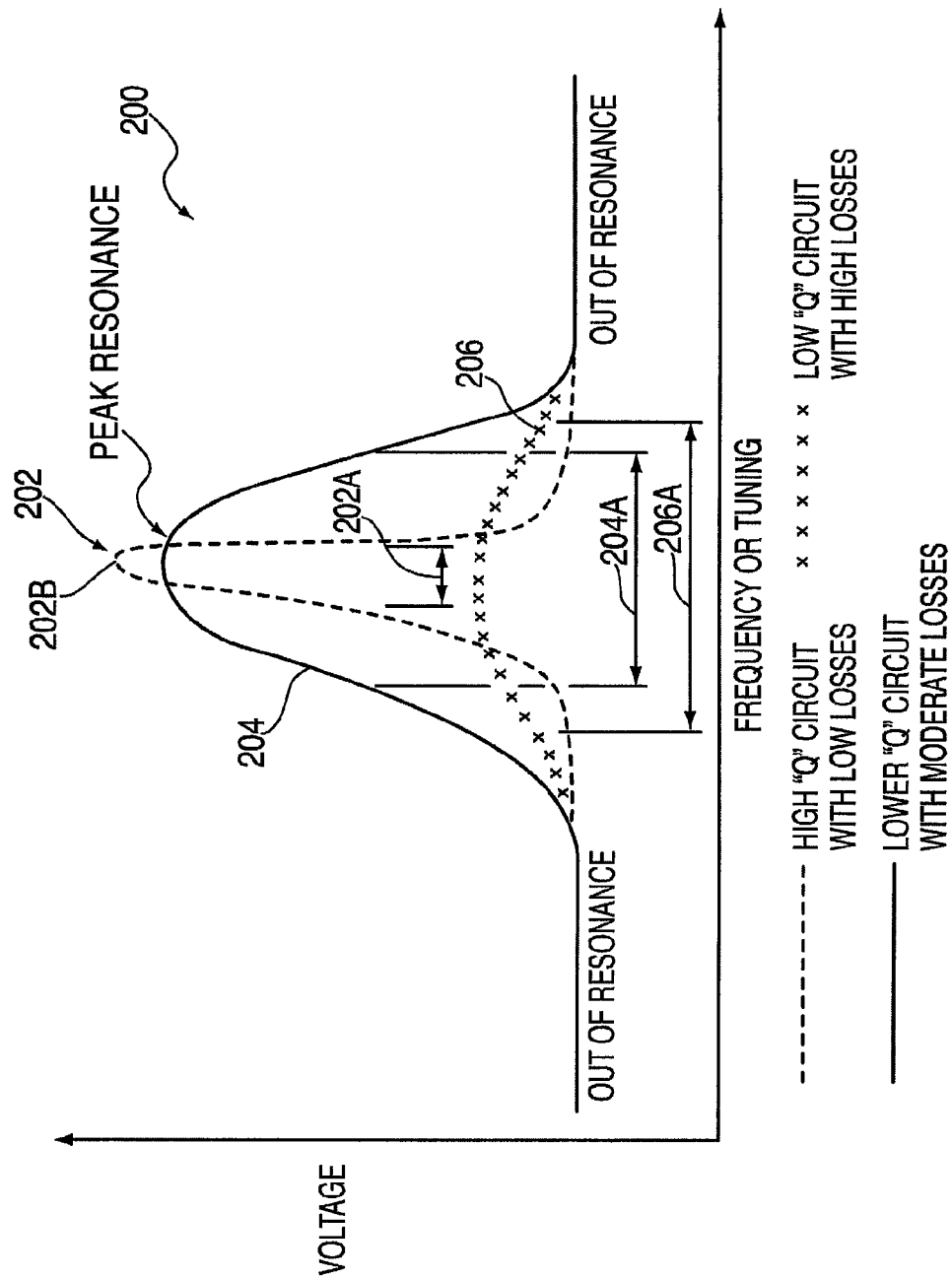
FIG. 2 is a graph of voltage versus frequency of the detection circuit portion of the transducer system of FIG. 1A illustrating the effect of differing quality-factor values on the sensitivity of the circuit.

Referring to FIG. 2, and also to FIG. 1A, FIG. 2 is a graph 200 showing three voltage-versus-frequency curves 202, 204, 206 illustrating resonance in RF circuits having three differing quality, or "Q-factors." The amount of voltage across an inductor-capacitor pair, such as either of inductor-capacitor pairs 116, 118 of parallel tuned circuits 110, 112 of FIG. 1A, depends on the source voltage applied to the tuned circuit and the Q-factor of the inductor-capacitor pair. The Q-factor of a tuned circuit is primarily related to the inductor's physical properties and how good it is, such as the magnetic core losses and wire losses. The quality of capacitors 124, 126 in parallel tuned circuits 110, 112 in detection circuit 102 is generally not of significance to the Q-factor of the respective parallel tune circuits because capacitors typically have lower losses as compared to inductors, here inductors 120, 122.

In FIG. 2, curve 202 illustrates that a tuned circuit having a high Q-factor, corresponding to low losses, has a relative narrow resonance band 202A. Consequently, the sensitivity of high-Q-factor tuned circuits is high. Curve 204 illustrates that a tuned circuit having a lower Q-factor has a wider resonance band 204A. The sensitivity of such a circuit is somewhat lower. Curve 206 illustrates a tuned circuit having a low Q-factor, i.e., high losses. As seen, the resonance band 206A is wide, and the circuit has low sensitivity.

As mentioned above, in this example, inductors 120, 122 are fixed at a particular inductance, and capacitors 124, 126 are variable. Assuming the tuning of parallel tuned circuits 110, 112 is initially out of their resonance band, as the capacitances of capacitors 124, 126 are varied, the RF voltage across these capacitors slowly rises as resonance is approached. This can be seen from, for example, curve 202 of FIG. 2 with the voltage increasing as the tuning approaches resonance from either side of peak 202B. If the capacitances of capacitors 124, 126 are continued to be changed in the same direction, the voltage will continue to rise, until a peak, e.g., peak 202B of curve 202 of FIG. 2, is reached in each parallel tuned circuit 110, 112. After that, any further changes of capacitances in the same direction will go beyond peak resonance and the voltages will start to drop.

With the proper tuning of parallel tuned circuits 110, 112, moving movable charge plate 150 in one direction will give a positive output signal (not shown) at wiper arm 142 of variable resistor 134, and moving it in the opposite direction will provide a negative voltage signal at the wiper arm. The exact amount of voltage per unit force is generally a function of the physical design of capacitive element 146 of transducer 104 and the sensitivity of detection circuit 102. As mentioned, in a prototype made by the present inventor, an output signal of about 20 millivolts per gram was obtained, and the output signal was linear up to about 25 grams. The maximum load limit is a function of, for example, beam thickness, and amount of travel.

The proper choice of parts is important for good operation, and all parts used in the prototypes made by the present inventor were of the surface mount type. Capacitors 124, 126, 130 were temperature-stable types and diodes 138, 140 were both in the same surface mount package for temperature stability. This allowed diodes 138, 140 to both be influenced in the same amount as temperatures changed, making the output of detection circuit 102 more stable. These design measures are good RF design options for stable operation of circuits operating in the tens-of-megahertz range.

All of the prototypes made by the present inventor operated at 12 megahertz. This frequency was chosen because the sizes of inductors 120, 122 and primary winding 156 were good for hand assembly. However, 12 megahertz should not be considered at all to be limiting relative to the broad range of frequencies that can be used in many other embodiments. In addition, the present inventor had to manually wind the coupling links of inductor 162 and secondary winding 158. Transducer system 100 will operate from a low-kilohertz regime to a hundreds-of-megahertz regime. The primary component values that change for wide excursions in frequency are the corresponding respective values of RF voltage source 108, primary and secondary windings 156, 158 in RF transformer 154, capacitors 124, 126 and inductors 120, 122. While the prototype of detection circuit 102 was made from surface-mount type devices, those skilled in the art will understand that depending on the operating regime at issue, such a detection circuit may be implemented using integrated-circuit type devices and techniques.

Figure 3:
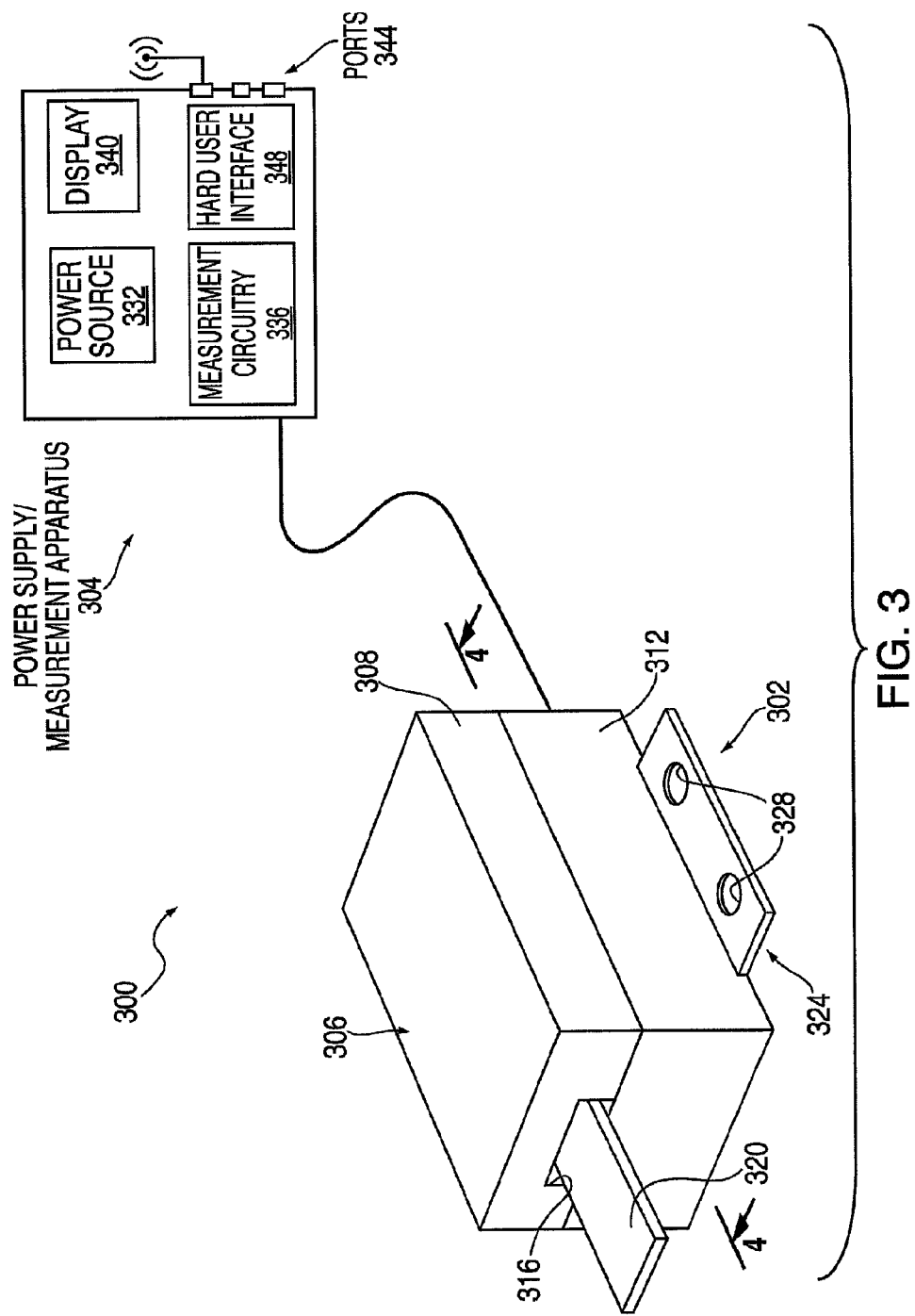
FIG. 3 is a combination isometric view/high-level block diagram of a force measuring system made in accordance with concepts of the present disclosure.
Figure 4:
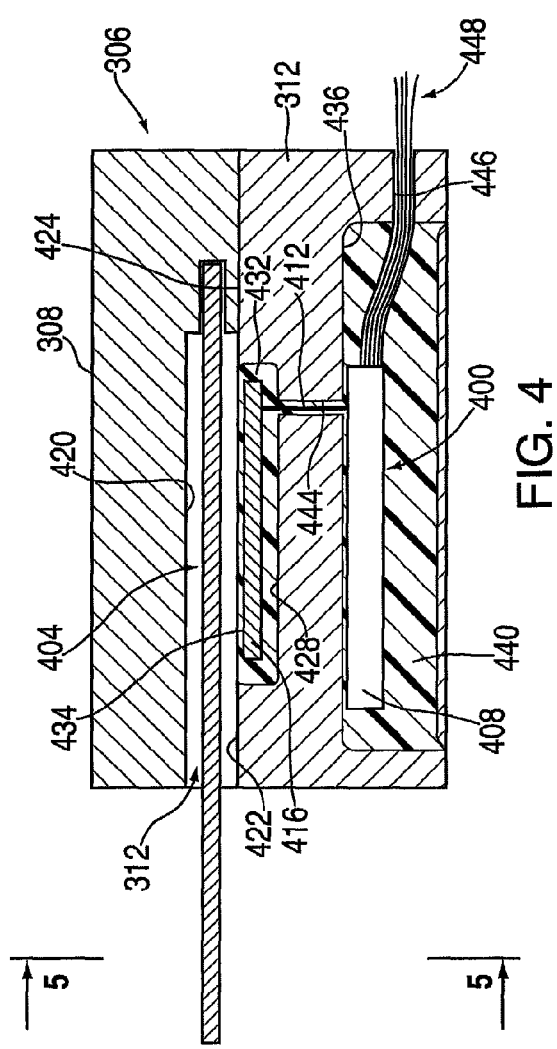
FIG. 4 is an enlarged cross-sectional view as taken along line 4-4 of FIG. 3.
Figure 5:
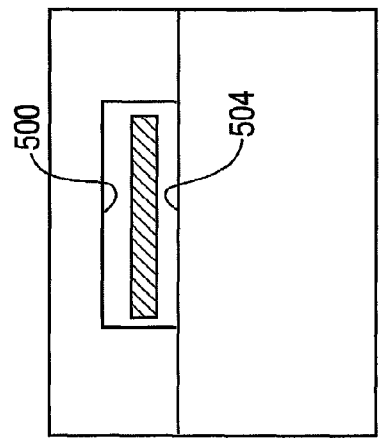
FIG. 5 is an enlarged cross-sectional view as taken along line 5-5 of FIG. 4.

Referring now to FIGS. 3-5, these figures illustrate a force measuring system 300 that includes an integrated force-transducing device 302 and a power supply/measurement apparatus 304. Integrated force-transducing device 302 integrates a transducer system 400 (FIG. 4) within a suitable housing 306. Transducer system 400 is a transducer system made in accordance with the broad concepts of the present disclosure, such as transducer system 100 of FIG. 1A. Transducer system 400 includes a capacitive transducer 404 and a detection circuit 408 electrically coupled to the capacitive transducer via a transducer link 412. When transducer system 400 is configured like transducer system 100 of FIG. 1A, details of capacitive transducer 404, detection circuit 408 and transducer link 412 can be found above relative to corresponding capacitive transducer 104, detection circuit 102 and transducer link 106 of FIG. 1A. Consequently, there is no need to repeat those details here.

Referring to FIGS. 3 and 4, in this example, housing 306 is generally a two-piece housing having a cuboid shape and consisting of a first piece 308 and a second piece 312 secured to one another to form a monolithic assembly. It is noted that while housing 306 is shown as being cuboidal, in other embodiments the housing may have another shape, such as cylindrical, among many others. Moreover, any housing provided need not have two pieces, but rather may have more or fewer as needed to suit a particular design.

First and second pieces 308, 312 may be secured to one another in any suitable manner, such as by brazing, adhesive bonding, soldering, welding, mechanical fastening, and any combination thereof. One end of housing 306 has a beam opening 316 that receives a cantilever beam 320 that forms part of capacitive transducer 404 (FIG. 4) located inside the housing. The size of beam opening 316 can be selected based on the deflection requirements of cantilever beam 320, including, as needed, stop surfaces 500, 504 (FIG. 5) that mechanically limit the displacement of the cantilever beam so as to inhibit damage to any components of capacitive transducer 404 and/or detection circuit 408.

Cantilever beam 320 may be made of any suitable material(s), such as one or more metals, one or more metal-containing composite, one or more plastics, one or more ceramics, and any combination thereof. In one particular example, cantilever beam 320 is made of a nickel steel alloy having a very low coefficient of thermal expansion, such as INVAR® steel (INVAR is a registered trademark owned by Imphy Alloys, Puteaux, France). If cantilever beam 320 is made of a dielectric material, an electrically conductive region must be located in relation to a fixed charge plate 416 (FIG. 4) so as to provide a movable charge plate that, when it moves, drives the variable capacitance that underlies the functionality of capacitive transducer 404. Of course, when cantilever beam 320 comprises a conductive material, such as the INVAR® steel mentioned above, at least a portion of the cantilever beam itself acts as the movable charge plate. Fixed charge plate 416 may be made of any suitable conductive material, such as a metal or metal containing composite. In one example, fixed plate 416 is made of the same INVAR® steel used to make cantilever beam 420.

In this example and referring to FIG. 4, each of first and second pieces 308, 312 of housing 306 is primarily a unitary monolithic block having various recesses and openings for accommodating certain parts of integrated force-transducing device 302. While each of first and second pieces 308, 312 of housing 306 may be made of any suitable material(s), in one particular example each piece is made from a block of aluminum into which the various recesses and openings are formed, for example, by molding or machining (or any other type of material removal operation) and any combination thereof. In this example, first piece 308 includes a beam recess 420 that receives a portion of cantilever beam 320 and is sized to allow the cantilever beam to deflect by a maximum desired amount. When first and second pieces 308, 312 confront one another as shown, in this embodiment beam recess 420 and surface 422 of the second piece together define beam opening 316 and a beam pocket 424 into which the cantilever beam is fixedly engaged. This fixed engagement may be effected in any suitable manner, such as by brazing, adhesive bonding, soldering, welding, mechanical fastening, shrink fit, and any combination thereof.

Second piece 312 of housing 306 in this example includes a first recess 428 that contains fixed charge plate 416 and other components of capacitive transducer 404, such as an RF transformer (not shown). When second piece 312 comprises an electrically conductive material, fixed charge plate 416 should be electrically insulated from the second piece by a suitable dielectric material 432, such as a fluoropolymer, epoxy, silicon or other material, and any combination thereof. Dielectric material 432 should be suitably rigid to inhibit movement of fixed charge plate 416 relative to second piece 312 of housing 306. Fixed charge plate 416 may also be electrically insulated from cantilever beam 420 (or movable conductive plate attached thereto) using a suitable dielectric layer 434, which may be in addition to air in the space between the first charge plate and cantilever beam (or movable plate attached thereto). Dielectric layer 434 may be made of any suitable dielectric material(s).

In this example, second piece 312 of housing 306 also includes a second recess 436 that contains detection circuit 408. Detection circuit 408 may be secured within second recess 436 using any suitable means, such as a backfill of a dielectric material 440, such as an epoxy, silicon or other non-electrically conductive material. In this example, second piece 312 of housing 306 also includes a first opening 444, which extends between first and second recesses 428, 436 through which transducer link 412 extends from capacitive transducer 404 and detection circuit 408, and a second opening 446 through which power and signal wires 448 extend to a point outside of integrated force-transducing device 302, here, to power supply/measurement apparatus 304 (FIG. 3). One, the other, both, or neither of first and second pieces 308, 312 of housing 306 may include, or have attached thereto, one or more structures for securing integrated force-transducing device 302 to a support structure (not shown). In this example, second piece 312 includes a tab 324 having a pair of apertures 328 for receiving mechanical fasteners, such as screws.

In this example, power supply/measurement apparatus 304 (FIG. 3) includes a power source 332 for providing power to detector circuit 408 (FIG. 4), particularly the voltage oscillator (not shown, but see, e.g., RF voltage source 108 of FIG. 1A). Voltage oscillators suitable for use as the voltage oscillator of detector circuit 408 are well-known in the art, as are power supplies for such oscillators. Therefore, further description of such power supplies is not necessary herein for those skilled in the art to make and use force-measuring system 300 or any other force-measuring system made in accordance with the broad concepts of the present disclosure.

Power supply/measurement apparatus 304 of this example also includes measurement circuitry 336 for translating a voltage signal output by integrated force-transducing device 302 into a measurement expressible, for example, in a standard unit of force, such as a newton or pound-force. Such measurement circuitry is well known in the art, such that a detailed explanation is not necessary here. In the present example, power supply/measurement apparatus 304 is configured as a standalone device, in this case meaning that it can both power integrated force-transducing device 302, but it can also display, via a display 340, measurements determined by measurement circuitry 336 using signals obtained from integrated force-transducing device 302. It is noted that measurement circuitry suitable for use as measurement circuitry 336 includes not only analog circuitry, but also digital circuitry that is programmable to provide the measurement determination functionality, and a combination of analog and digital circuitry. In one example, measurement circuitry 336 includes, among other things, an analog-to-digital (A/D) converter and a microprocessor (both not shown). The A/D converter converts the signal from integrated force-transducing device 302 to a digital value that it provides to the microprocessor, which may solve a suitable equation for calculating a force value as a function of the value of the digitized signal.

As those skilled in the art will readily appreciate, power supply/measurement apparatus 304 may include any one or more of a variety of useful features, such as one or more communications ports 344 (wired and/or wireless). Such communications ports 344 can be used for communicating data, such as raw analog and/or digital signals acquired from integrated force-transducing device 302 and/or calculated measurement data, to another apparatus, such as a general purpose computer, digital storage device, etc. (not shown). Another useful feature that power supply/measurement apparatus 304 may include is a hard user interface 348 for allowing a user to manually tune detection circuit 408 (FIG. 4), for example, in the manner discussed above. Alternatively, or in addition, to hard user interface 348, power supply/measurement apparatus 304 may include a soft user interface (not shown) for providing the same functionality. Such a soft user interface may be displayable on, for example, display 340 and implemented in software. It is noted that in other embodiments, a suitable power supply/measurement apparatus may be implemented in a personal computing machine, such as a desktop or laptop computer. For example, a desktop computer may be fitted with a daughterboard having appropriate circuitry, such as an analog-to-digital converter, transducer power supply, etc., for interfacing with a transducing device made in accordance with broad concepts of the present disclosure. In other embodiments, a transducing device made in accordance with broad concepts of the present disclosure may incorporate the appropriate interfacing circuitry such that all that is needed to interface with a personal computer or other computing machine is a suitable connection between the device and the machine, such as a universal serial bus connection, a FIREWIRE (IEEE 1394) connection and a BLUETOOTH (IEEE 802.15.1) connection, among others.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:
1. A transducer system, comprising:
   an alternating current (AC) voltage source for providing a constant frequency voltage;
   a tuned ratio detector AC coupled to said AC voltage source, said tuned ratio detector including first and second tuned circuits each coupled to said AC voltage source by corresponding respective first and second coupling elements;
   a transducer link inductively coupled to said first tuned circuit;
   a transducer electrically coupled to said transducer link; and
   signal output circuitry electrically coupled between said first and second tuned circuits.
2. A transducer system according to claim 1, wherein said transducer is an active capacitive transducer.
3. A transducer system according to claim 1, wherein said transducer comprises a toroidal core and a winding wound around said toroidal core and in electrical communication with said transducer link.
4. A transducer system according to claim 1, wherein said AC voltage source comprises a crystal oscillator.
5. A transducer system according to claim 1, wherein said transducer is an active capacitive transducer and said transducer link includes a transformer electrically coupled between said active capacitive transducer and said first tuned circuit.
6. A transducer system according to claim 1, wherein each of said first and second coupling elements is a resistor.
7. A transducer system according to claim 1, wherein each of said first and second coupling elements is a radio frequency transformer.
8. A transducer system according to claim 1, wherein each of said first and second tuned circuits comprises a parallel-connected inductor-capacitor pair.
9. A transducer system according to claim 1, wherein the constant frequency voltage has a frequency, each of said first and second tuned circuits being tuned substantially to said frequency.
10. A transducer system according to claim 5, wherein said active capacitive transducer is a cantilever-beam type transducer.
11. A transducer system according to claim 1, wherein said signal output circuitry comprises a first diode connected to said first tuned circuit, a second diode connected to said second tuned circuit, and a variable resistor electrically coupled between said first and second diodes.
12. A transducer system according to claim 11, wherein said variable resistor comprises a wiper arm and said signal output circuitry further comprises a capacitor coupled between said wiper arm and a ground.
13. A transducer system, comprising:
    a cantilever-beam capacitive transducer for providing a transducer signal;
    a detection circuit for detecting the transducer signal and outputting a measurement signal as a function of the transducer signal, said detection circuit including:
        an alternating current (AC) voltage source for providing a constant frequency voltage;
        a tuned ratio detector AC coupled to said AC voltage source, said tuned ratio detector including first and second tuned circuits each coupled to said AC voltage source by corresponding respective first and second coupling elements;
        a transducer link inductively coupling said cantilever-beam capacitive transducer to said first tuned circuit; and
        signal output circuitry electrically coupled between said first and second tuned links for outputting the measurement signal; and
    a housing supporting said cantilever-beam capacitive transducer.

14. A transducer system according to claim 13, wherein said AC voltage source comprises a crystal oscillator.

15. A transducer system according to claim 13, wherein said transducer link includes a transformer electrically coupled between said cantilever-beam capacitive transducer and said first tuned circuit.

16. A transducer system according to claim 13, wherein each of said first and second coupling elements is a resistor.

17. A transducer system according to claim 13, wherein each of said first and second coupling elements is a radio frequency transformer.

18. A transducer system according to claim 13, wherein each of said first and second tuned circuits comprises a parallel-connected inductor-capacitor pair.

19. A transducer system according to claim 13, wherein the constant frequency voltage has a frequency, each of said first and second tuned circuits being tuned substantially to said frequency.

20. A transducer system according to claim 13, wherein said signal output circuitry comprises a first diode connected to said first tuned circuit, a second diode connected to said second tuned circuit, and a variable resistor electrically coupled between said first and second diodes.

21. A transducer system according to claim 20, wherein said variable resistor comprises a wiper arm and said signal output circuitry further comprises a capacitor coupled between said wiper arm and a ground.

22. A transducer system according to claim 13, wherein said housing includes a cavity and said detection circuit is contained in said cavity.

* * * * *